United States Patent [19]

Thanhaeuser

[11] 3,855,552

[45] Dec. 17, 1974

[54] OSCILLATOR UTILIZING COMPLEMENTARY TRANSISTORS IN A PUSH-PULL CIRCUIT

[75] Inventor: Gerhard Thanhaeuser, Mering, Germany

[73] Assignee: Siemens Aktiengesellschaft, Berlin & Munich, Germany

[22] Filed: Dec. 17, 1973

[21] Appl. No.: 424,928

[30] Foreign Application Priority Data

Dec. 21, 1973 Germany .......................... 2262782

[52] U.S. Cl. ............ 331/116 R, 331/114, 331/159, 331/168

[51] Int. Cl. ........................................ H03b 5/36

[58] Field of Search ......... 331/114, 116 R, 159, 168

[56] References Cited

UNITED STATES PATENTS

| | | | |
|---|---|---|---|
| 2,788,493 | 4/1957 | Zawels | 331/114 |
| 3,665,344 | 5/1972 | Rosa et al. | 331/116 |
| 3,806,831 | 4/1974 | Kleinberg | 331/116 |

FOREIGN PATENTS OR APPLICATIONS

| | | |
|---|---|---|
| 1,472,196 | 1/1966 | France |

*Primary Examiner*—John Kominski
*Attorney, Agent, or Firm*—Hill, Gross, Simpson, Van Santen, Steadman, Chiara & Simpson

[57] ABSTRACT

An oscillator constructed using complementary transistors in a push-pull configuration employs means to vary at least one base voltage divider resistor to adjust the working points of the complementary transistors and an additional transistor having its emitter-collector circuit connected between the bases of the complementary transistors, which additional transistor has its conduction controlled by the output signal of the oscillator so that the collector-emitter region thereof is progressively driven toward lower and lower resistance in response to increasing amplitude of oscillation.

6 Claims, 2 Drawing Figures

OSCILLATOR UTILIZING COMPLEMENTARY TRANSISTORS IN A PUSH-PULL CIRCUIT

Figures 1, 2:
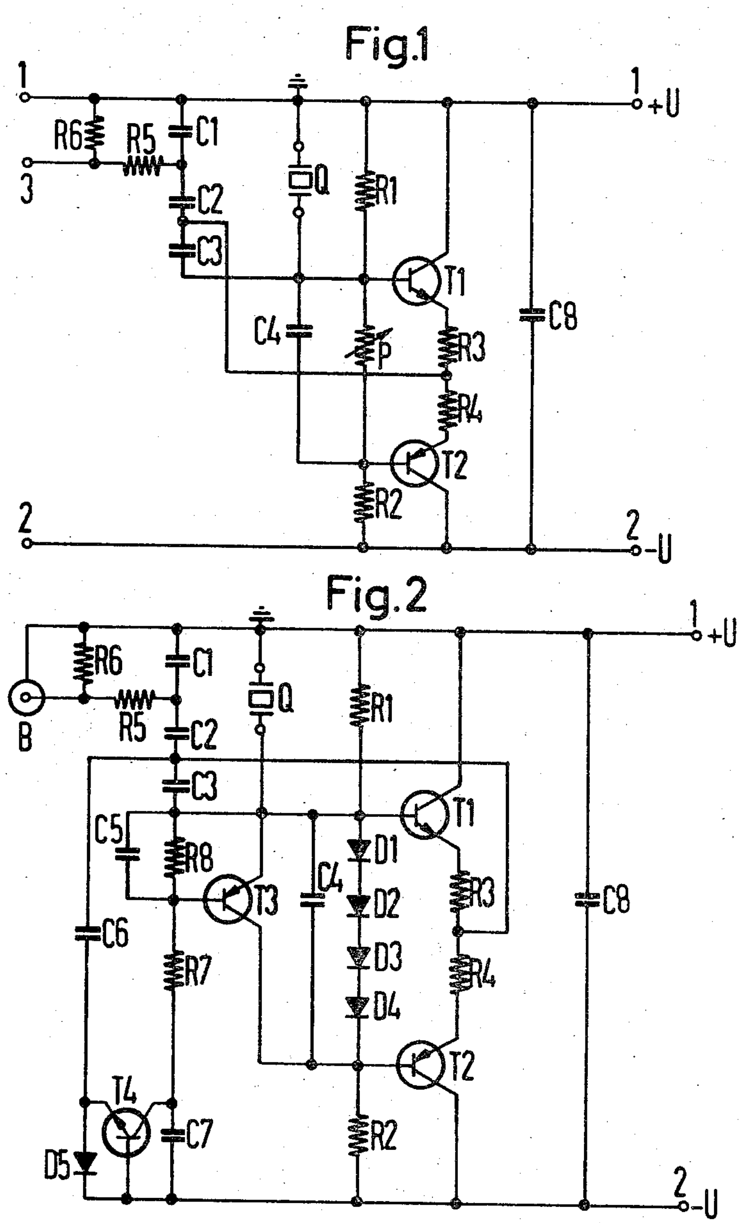

The present invention relates to an oscillator constructed with complementary transistors in a push-pull circuit configuration, in which the working points of the complementary transistors can be adjusted by varying at least one base voltage divider resistor.

The primary object of the invention is to provide an oscillator of the type mentioned above which is distinguished by a particularly low supply current consumption, versatility of application, and, nevertheless, simplicity of construction.

In accordance with the invention, the foregoing object is achieved through the provision of a further transistor whose conduction is controlled by the output signal from the oscillator, and whose collector-emitter region, connected between the base electrodes of the complementary transistors, is driven toward progressively lower and lower resistance with increasing amplitude of oscillation.

Through these techniques, an oscillator is obtained in which, due to the class A operation of the complementary transistors employed therein, reliable initiation of oscillation is insured in all cases when the supply voltage is switched on. With increasing amplitude of oscillation, the resistance of the transistor connected between the base electrode of the complementary transistors is reduced, so that the oscillator transfers from class A operation to class A-B operation, class B operation or class C operation. Furthermore, through the medium of the bias applied to the push-pull amplifier, the conduction angle of the complementary transistors, and therefore the amplitude of the output signal from the oscillator, is adjustable within wide limits in a simple manner. The gain of the complementary transistors is reduced during initiation of oscillation so that the complementary transistors only operate in parallel during a portion of the cycle time. In this manner, an oscillator circuit is created which is distinguished by extremely low current consumption and high efficiency. An additional advantage is provided in that even harmonics of the desired oscillation are suppressed.

One aspect of the invention, as exemplified in a preferred embodiment of the invention, resides in the interconnections of the complementary transistors, and associated components, with the electrical supply. The complementary transistors have their respective collectors connected directly to respective poles of the electrical supply, and have their emitters connected to each other through a pair of serially connected ohmic resistors of equal value. A return is provided from the point of connection between the two resistors connected to the emitters of the complementary transistors, to an oscillatory circuit, the developed oscillation being picked off from this oscillatory circuit.

If the aforementioned technique is adopted, then despite the nonlinear operation of the complementary transistors in the stabilized state (class B or class C operation), it is quite simple to ensure that the distortion factor of the oscillation selectively picked off at the oscillatory circuit is low. The oscillator circuit simply constructed in this manner therefore satisfies a plurality of applications, in terms of the quality of the oscillation produced.

In a further development of the invention, the oscillatory circuit comprises a series arrangement, connected in parallel with an oscillator crystal, of first, second and third capacitors, and is connected, on the one hand, together with one terminal of the first capacitor and a first terminal of the crystal to one pole of the electrical supply, on the other hand, together with one terminal of the third capacitor and the second terminal of the crystal to the base electrodes of the complementary transistors. A load resistor, across which the generated oscillation is picked off, is connected to the junction between the first and second capacitors, while the return is connected to the junction between the second and third capacitors.

With the foregoing construction, an oscillator circuit of the capacitive three-point type, with aperiodic excitation of the crystal, is created. The frequency of oscillation is determined here by the fundamental of the crystal, and if the oscillator circuit dimensions are fixed, can be varied within a range of about ± 10 percent around the center frequency, by the use of different crystals. Furthermore, by the selectivity of the crystal used in each case, the result oscillation has a particularly low distortion factor. In addition, it is advantageously provided that an additional inductor can be eliminated and the load resistance can be transformed upwardly by the oscillatory circuit with the crystal. Because of these properties, the present oscillator will advantageously be employed for the underground amplifiers of carrier frequency systems, to do duty as a locating oscillator, because oscillators of this kind can only be supplied with very low operating currents, and, furthermore, the oscillator must be capable of rapid frequency change, e.g. by the use of plug-in crystals in the frequency locating range. Considering a carrier frequency system comprising, for example, 2700 speech channels the frequency locating range extends from 13.3 MHz to 13.7 MHz. For this center frequency range, only a single type of oscillator circuit is required. The particular desired frequency position is determined by selection of the crystal.

Furthermore, in one embodiment of the invention, a control transistor is provided whose emitter is connected to the junction between the second and third capacitors. The base of the control transistor is connected to one pole of the electrical supply and the collector of the transistor is connected to the base electrode of the additional transistor connected across the bases of the complementary transistors. The base-emitter diode of the control transistor is shunted by a diode connected in an opposed parallel relationship to the base-emitter diode.

The control transistor, whose base-emitter diode is shunted by a diode, acts as a directional amplifier and is rendered conductive when the output signal applied to the series arrangement of first and second capacitors reaches the threshold voltage of the diode in the course of the initial transient phase. The collector current of the control transistor drives the other transistor conductive so that the bias voltage on the complementary transistors drops and causes the complementary transistors to change from class A operation to class B or class C operation. The desired amplitude of the output signal from the oscillator can be adjusted by the choice of the capacitances of the voltage divider constituted by the first and second capacitors, because the reference formation in the amplitude control loop takes place in the series arrangement of these two capacitors.

Furthermore, an embodiment of the invention is provided in which, between the base electrodes of the complementary transistors, there is a series arrangement comprising four diodes poled in the forward direction vis-a-vis the supply voltage.

By this measure, it is ensured, in a simple manner, that the supply current drawn by the oscillator circuit at the time the oscillator is switched on, is restricted to a certain maximum value, and the same restriction is applied also in the event that a plug-in crystal should be removed from its socket during a frequency change.

Other objects, features and advantages of the invention, its organization, construction and operation will be best understood from the following detailed description of preferred embodiments of the invention taken in conjunction with the accompanying drawing, on which:

FIG. 1 is a schematic circuit diagram of an oscillator circuit in which, by way of a variable resistor, a potentiometer is provided between the base electrodes of the complementary transistors; and FIG. 2 is an embodiment of the invention having additional circuit features connected into the oscillator generally illustrated in FIG. 1.

The oscillators illustrated in FIGS. 1 and 2 operate in a pushpull manner and comprises a pair of complementary transistors T1 and T2 which are connected in a series arrangement between a pair of electrical supply terminals 1 and 2 which carry the respective supply potentials +U (ground) and —U. In addition, an oscillatory circuit comprising a series arrangement of first, second and third capacitors C1, C2 and C3, and a crystal Q is provided, which oscillatory circuit is driven by the push-pull emitter-follower arrangement, incorporating the transistors T1 and T2, on the lines of the three-point circuit.

The effective gain of the transistors T1 and T2 is determined by the resistances of respective emitter resistors R3 and R4, which, for reasons of symmetry, are identical to one another. Likewise, the resistance values of a pair of resistors R1 and R2 connected between the respective bases and supply terminals associated with each transistor are identical so that in the quiescent condition the junction between the emitter resistors R3 and R4 is at about half the supply voltage U. The load, represented in the drawing by a pair of resistors R5 and R6 connected across the capacitor C1, is transformed upwardly by the series connection of the capacitors C1, C2 and C3; the oscillator crystal Q here operates in the inductive range and is poled by a capacitive element (load capacitor) which has not been illustrated, but whose capacitance corresponds approximately to the capacitance resulting from the series connection of the capacitors C1, C2 and C3. The output signal of the oscillator is picked off across the terminals 1 and 3 in the circuit illustrated in FIG. 1 and at the socket B in the circuit illustrated in FIG. 2.

In the oscillator circuit shown in FIG. 1, the working point of the transistors T1 and T2 is determined by the position of a potentiometer P, here a variable resistor, connected between the base electrodes of the transistors. The transistors T1 and T2 are connected in parallel with respect to alternating current, but are connected in series with respect to direct current.

At the initiation of oscillation, the effective gain in the feedback loop is determined by the parallel arrangement of the emitter resistors R3 and R4, as long as the circuit is in the class A mode of operation. With a further increase in the amplitude of oscillation, the resistance of the potentiometer P is reduced. Consequently, the two complementary transistors T1 and T2 transfer to class B or class C operation, their gain decreases, and parallel operation then exists only during part of the cycle time. Therefore, by operating the potentiometer P, the conduction angle of the transistors T1 and T2, and therefore the amplitude of the output signal from the oscillator, can be adjusted within wide limits through the bias voltage applied to the push-pull amplifier. By these measures a push-pull oscillator with complementary transistors T1 and T2 whose operating current is switched is obtained which is distinguished by an extremely low current consumption and high efficiency. Despite the nonlinear behavior of the transistors T1 and T2, a good distortion factor is insured because the high frequency voltage generated by way of the output signal is picked off by way of a correspondingly selective oscillatory circuit formed by the crystal Q and the capacitors C1, C2 and C3, and even harmonics are suppressed by the push-pull arrangement. The crystal control oscillatory circuit also results in an upper transformation of the load resistance (R5, R6), which is otherwise only possible if an initial inductor is used.

Referring to the oscillator circuit illustrated in FIG. 2, the potentiometer P employed in the circuit of FIG. 1 as a variable resistor between the base electrodes of the complementary transistors T1 and T2 has been replaced by an additional transistor T3. A diode arrangement comprising a plurality of diodes D1, D2, D3 and D4 is connected in parallel with the collector-emitter region of the transistor T3 and, at the time of switch-on and in the event that the plug-in crystal Q is withdrawn from its socket, limits the operating direct current but may be drawn to a fixed maximum.

A control transistor T4, together with a diode D5 connected between its base and emitter electrodes and poled opposite its base-emitter diode, acts as a rectifying amplifier. It goes conductive when the amplitude of the output signal applied to the series arrangement of the capacitors C1 and C2 reaches a value of about 0.6 V peak voltage, for example, this corresponding to the threshold voltage of the diode D5. The collector of the control transistor T4 is connected to the base of the transistor T3 by way of a resistor R7 and the collector current of the control transistor T4 drives the transistor T3 conductive so that the bias voltage on the push-pull transistors T1 and T2 decreases accordingly. While the complementary transistors T1 and T2 operate class A at the initiation of the starting transient phase, beyond a certain amplitude of oscillation and with decreasing bias voltage, they convert to class A-B, class B or class C operation. The desired amplitude of the output voltage can be adjusted by selection of the capacitances of the first and second capacitors C1 and C2 which form a voltage divider, because the reference formation in the amplitude control loop takes place in the series arrangement of the two capacitors C1 and C2.

An additional capacitor C6 is connected between the emitter of the transistor T4 and the junction between the capacitors C2 and C3 serves to couple the rectifying amplifier to the oscillator circuit, and additional capacitors C4, C5 and C7 are connected as buffer capacitors.

The temperature dependency of the threshold voltage of the control transistor T4, this voltage being used as a reference quantity, is about −2 mV/°C, which means that the output signal has a low temperature coefficient of only around −0.35 %/°C. This temperature coefficient can be reduced if the load resistor R5 is replaced, for example, by a combination of a negative temperature coefficient resistor and an ohmic resistor.

If crystals of different quality factors are used in the present oscillator circuit, then in the crystal controlled resonant circuit, apart from the losses caused by picking off of the output signal, different levels of loss occur in the series resonant resistance of the particular crystals. This means that the push-pull transistors, in the stabilized condition, operate in either the push-pull class A-B, push-pull class B or push-pull class C mode. More specifically, a high ohmic series resonant resistance means relatively high losses and results in the complementary transistors T1 and T2 operating class A-B, and a low ohmic series resonant resistance, on the other hand, produces relatively low losses, leading to class C operation of the complementary transistors T1 and T2. In all cases, however, amplitude control is effected by changing the conduction angle of the transistors T1 and T2.

Application of the oscillator circuit of the present invention is advantageous, in particular, in situations in which a very low current consumption and rapid frequency change are required. For example, such oscillators find applications in a carrier frequency system with 2700 speech channels, as locating oscillators which are operated at very low current levels (<2 mA) and in which a simple frequency change by the use of plug-in crystals is required within a range of from 13.3 MHz to 13.7 MHz. The picking off of the oscillatory voltage, whose frequency corresponds to the fundamental of the crystal Q employed in the circuit, takes place directly at the crystal controlled oscillatory circuit, and the low ohmic load provided by the resistors R5 and R6 is transformed upwardly without the need for an inductor or a transformer. The overall consumption of direct current amounts to 1.4 mA, for example, at an operating voltage of 15–18 V, and an output voltage of 86.5 mV across a resistance of 75 ohm, with an internal resistance also of 75 ohm is obtained.

With respect to the highest possible efficiency and a low distortion factor, if the oscillator circuit is of fixed dimensions, satisfactory operation in a range of about ± 10 percent around the center frequency is possible when different crystals are employed.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An oscillator circuit comprising an oscillatory circuit, first and second complementary transistors connected in a push-pull configuration and each having a base and connected to said oscillatory circuit, and a variable voltage divider connected between said bases for adjusting the working points of said first and second complementary transistors, said variable voltage divider comprising a third transistor including a base connected to said oscillatory circuit and an emitter and a collector connected to respective bases of said first and second complementary transistors and a collector-emitter region driven toward progressively lower and lower resistance in response to increasing amplitude of oscillation.

2. The oscillator of claim 1 wherein said first and second complementary transistors each have a collector connected to a respective pole of an electrical supply and an emitter connected to the emitter of the other complementary transistor, first and second serially connected resistors of equal value connecting said emitters together, the junction of said first and second resistors connected to said oscillatory circuit as a return path.

3. The oscillator of claim 2, wherein said oscillatory circuit comprises an oscillator crystal, first, second and third serially connected capacitors connected in parallel with said crystal, said crystal having a first terminal connected to one pole of the electrical supply and a second terminal connected to said bases of said first and second complementary transistors, and a load resistance connected to the one pole of the electrical supply and across said first capacitor, said return from the junction of said first and second resistors connected to the junction between said second and third capacitors.

4. The oscillator according to claim 3, wherein said load resistance comprises a plurality of serially connected resistors, and a junction of said plurality of resistors serving as an output terminal for picking off the generated oscillation.

5. The oscillator of claim 3, comprising a fourth transistor as a control transistor having an emitter, a base and a collector, said emitter of said fourth transistor connected to the junction between said second and third capacitors, said base of said fourth transistor connected to a terminal of the electrical supply, and said collector of said fourth transistor connected to said base of said third transistor, and a diode connected between said emitter and said base of said fourth transistor and poled in a direction opposite to that of the base-emitter diode of said fourth transistor.

6. The oscillator of claim 1, comprising a plurality of serially connected diodes connected between said bases of said first and second complementary transistors and poled in the forward direction with respect to the polarity of the electrical supply for limiting the operating direct current to a fixed maximum.

* * * * *